(12) United States Patent
Tsuchi

(10) Patent No.: US 10,650,770 B2
(45) Date of Patent: *May 12, 2020

(54) OUTPUT CIRCUIT AND DATA DRIVER OF LIQUID CRYSTAL DISPLAY DEVICE

(71) Applicant: LAPIS Semiconductor Co., Ltd., Yokohama (JP)

(72) Inventor: Hiroshi Tsuchi, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 5 days.

This patent is subject to a terminal disclaimer.

(21) Appl. No.: 16/243,249

(22) Filed: Jan. 9, 2019

(65) Prior Publication Data

US 2019/0147825 A1 May 16, 2019

Related U.S. Application Data

(63) Continuation of application No. 15/818,628, filed on Nov. 20, 2017, now Pat. No. 10,199,007.

(30) Foreign Application Priority Data

Nov. 21, 2016 (JP) .................................. 2016-225894

(51) Int. Cl.
*G06F 1/00* (2006.01)
*G09G 3/36* (2006.01)
(Continued)

(52) U.S. Cl.
CPC ......... *G09G 3/3688* (2013.01); *G09G 3/3614* (2013.01); *H03F 3/303* (2013.01);
(Continued)

(58) Field of Classification Search
CPC .......... G09G 3/32; G09G 3/36; G09G 3/3688; H03F 3/45; H03K 5/24
See application file for complete search history.

(56) References Cited

U.S. PATENT DOCUMENTS

2017/0235423 A1* 8/2017 Hwang ................. G06F 3/0418
345/174

FOREIGN PATENT DOCUMENTS

JP       2009-244830 A    10/2009
JP       2012-039345 A     2/2012

* cited by examiner

*Primary Examiner* — Michael A Faragalla
(74) *Attorney, Agent, or Firm* — Rabin & Berdo, P.C.

(57) ABSTRACT

A differential amplifier circuit includes a differential input stage, a first current mirror, a second current mirror, a first current source circuit, and a second current source circuit. The first current source circuit has a first transistor of a first conductivity type with a control terminal supplied with a first bias voltage, and a second transistor of a second conductivity type with a control terminal supplied with a second bias voltage. An output amplifier circuit includes a third transistor of the first conductivity type and a fourth transistor of the second conductivity type. A control circuit has a fifth transistor of the first conductivity type with a first terminal connected to a connection point between the other end of the second current source circuit and the control terminal of the fourth transistor in the output amplifier circuit, with a second terminal connected to an output node of the second current mirror, and with a control terminal receiving the first bias voltage.

9 Claims, 8 Drawing Sheets

(51) Int. Cl.
*H03F 3/45* (2006.01)
*H03F 3/30* (2006.01)
(52) U.S. Cl.
CPC ....... *H03F 3/4521* (2013.01); *H03F 3/45246* (2013.01); *H03F 3/45273* (2013.01); *G09G 2300/0426* (2013.01); *G09G 2300/0838* (2013.01); *G09G 2310/0286* (2013.01); *G09G 2310/0289* (2013.01); *G09G 2310/0291* (2013.01); *G09G 2330/021* (2013.01); *G09G 2330/06* (2013.01)

OUTPUT CIRCUIT AND DATA DRIVER OF LIQUID CRYSTAL DISPLAY DEVICE

CROSS-REFERENCE TO RELATED APPLICATIONS

This is a continuation of U.S. application Ser. No. 15/818,628, filed on Nov. 20, 2017, and allowed on Sep. 26, 2018, which is based upon and claims the benefit of priority from Japanese Patent Application No. 2016-225894, filed on Nov. 21, 2016. The entire disclosures of these prior U.S. and foreign applications are incorporated herein by reference.

BACKGROUND OF THE INVENTION

1. Field of the Invention

The present invention relates to an output circuit and a data driver of a liquid crystal display device employing the output circuit.

2. Description of the Related Art

Currently, in the field of display devices, active matrix liquid crystal display devices are in the mainstream. The liquid crystal display device is widely used for most display devices, for example, from personal digital assistants such as smartphones or tablet terminals to high-resolution large-screen devices such as 4K or 2K monitors or TVs.

The data driver for driving a display panel is required of outputting highly accurate gradation voltages as well as driving data lines at high speeds in order to support displaying high-quality images or displaying moving images. Thus, the output circuit of a data driver is required of a high driving capability in order to charge and discharge the data line capacity of the display panel at high speeds. Furthermore, in order to achieve a good display quality, also required are the symmetry and uniformity of the gradient of a drive waveform at the time of charging and discharging the data lines, that is, the slew rate of the output amplifier circuit of the data driver.

Furthermore, in the liquid crystal display, the voltage level of a voltage applied to the liquid crystal controls the transmittance according to the gradation. Then, in order to prevent deterioration in the liquid crystal, the polarity of the voltage to be applied to the liquid crystal has to be varied at certain intervals. In general, the data driver employs such a drive scheme as to drive data lines by switching at certain intervals between a positive gradation voltage and a negative gradation voltage with respect to a constant common voltage. Thus, the data driver requires a supply voltage (maximum about 20 V) which is about two times greater than the applied voltage range of the liquid crystal.

Recently, in order to reduce power consumption, the drive scheme for the data driver transitions from the dot inversion driving by which the positive and negative polarities are switched for each data period to the column inversion driving by which the positive and negative polarities are switched for each one frame period (one-screen rewriting period). The data driver for the column inversion driving employs, as an output circuit, a half VDD amplifier for outputting positive and negative gradation voltages using three power supplies, i.e., an upper level power supply voltage VDD, a middle level power supply voltage VML (around the common voltage), and a low level power supply voltage VSS (=GND).

Known as the half VDD amplifier for the column inversion driving is an output amplifier of a two-output configuration which is provided with drive power supplies for the respective positive/negative polarity dynamic ranges (for example, Japanese Patent Application Laid-Open No. 2009-244830).

In the two-output amplifier, the supply voltage range of the differential input stage circuit is full VDD (=VDD−VSS), and the respective supply voltage ranges of the two-output stage circuit are the positive half VDD (=VDD−VML) and the negative half VDD (=VMH−VSS) (for example, VML=VMH=VDD/2). Then, the two output stage circuits are configured to be switchable depending on the voltage polarity of an input voltage of the differential input stage circuit.

This is to prevent degradation in display quality by sharing the differential input stage circuit, which determines the variation in offset voltage, at the time of output of positive voltages and at the time of output of negative voltages because variations in the offset voltage of the positive and negative output voltages (i.e., errors from the expectation value of output voltages) may lead to deterioration in display quality.

However, for high-speed driving (the column inversion driving) of heavy capacitive loads, for example, in a charging operation, with an initial state in which a positive voltage around the middle level power supply voltage VML is input as a positive input voltage of the differential input stage circuit, a positive voltage around high level power supply voltage VDD in the first data period is input. At this time, the gate voltages of Pch and Nch output stage transistors in the output stage circuit may be significantly deviated from a positive voltage range in a transient manner and thereby reduced to a potential lower than the middle level power supply voltage VML. At this stage, the first data period is ended, and then when the positive input voltage is changed to a lower voltage (for example, around the middle level power supply voltage VML) in the next second data period, the process will not be switched to a discharging operation unless the gate voltages of the Pch and Nch output stage transistors exceed the middle level power supply voltage VML and rise to a potential at which the Nch output stage transistor is turned on. Thus, in the second data period, a considerable output signal delay may be produced, thereby causing degradation in display quality.

Likewise, in the discharging operation, in the initial state in which a negative voltage around the middle level power supply voltage VMH is input as a negative input voltage of the differential input stage circuit, a negative voltage around the low level power supply voltage VSS is input in the first data period. At this time, the gate voltages of the Pch and Nch output stage transistors in the output stage circuit may be significantly deviated from a negative voltage range in a transient manner and thereby raised to a potential higher than the middle level power supply voltage VMH. At this stage, the first data period is ended, and then when the negative input voltage is changed to a higher voltage (for example, around the middle level power supply voltage VMH) in the next second data period, the process will not be switched to a charging operation unless the gate voltages of the Pch and Nch output stages exceed the middle level power supply voltage VMH and are reduced to a potential at which the Pch output stage transistor is turned on. Thus, in the second data period, a significant output signal delay (the asymmetry or non-uniformity of output waveforms) may be produced, leading to degradation in display quality.

In this context, such an output circuit was conceived in which the differential amplifier circuit, to which a positive voltage is input, is provided with a control transistor, which is turned on or off when receiving a bias signal, between a low potential current mirror circuit and the gate of the Nch output stage transistor. In this output circuit, the control transistor is turned off when the gate of the Nch output stage transistor is to be further reduced from the middle level power supply voltage VML, thereby preventing the gate voltage of the output stage transistor from being reduced below the middle level power supply voltage (for example, FIG. 1 in Japanese Patent Application Laid-Open No. 2012-39345). Likewise, such an output circuit was conceived in which the differential amplifier circuit, to which a negative voltage is input, is provided with a control transistor, which is turned on or off when receiving a bias signal, between a high potential current mirror circuit and the gate of the Pch output stage transistor. In this output circuit, the control transistor is turned off when the gate of the Pch output stage transistor is to be further raised from the middle level power supply voltage VMH, thereby preventing the gate voltage of the output stage transistor from being raised above the middle level power supply voltage (for example, FIG. 2 in Japanese Patent Application Laid-Open No. 2012-39345).

In the output circuit in Japanese Patent Application Laid-Open No. 2012-39345 above, a clamping bias signal to be supplied to the gate of the control transistor is additionally required, thus leading to an increase in bias lines. Furthermore, in the configuration of Japanese Patent Application Laid-Open No. 2009-244830 above, a similar clamp element can be added to the respective positive and negative output amplification stages so as to prevent the gate voltage of the positive output stage transistor from deviating from a positive side power supply voltage range and prevent the gate voltage of the negative output stage transistor from deviating from a negative supply voltage range, thereby reducing output signal delay. However, in this case, an additional clamping bias signal is also required, leading to an increase in bias lines.

Since the bias lines of a data driver for display are typically to be wired in common from a bias circuit at the center of a chip to a plurality of output circuits, an increased number of bias lines may be more easily subjected to the influence of noise caused, for example, by coupling with crossing conductor traces, thereby leading to an increase in the risk of malfunction. Furthermore, from the viewpoint of ease of design, a less number of bias lines may be preferable, and the number of conductor traces is required to be reduced.

SUMMARY OF THE INVENTION

An output circuit according to the present invention includes: a differential amplifier circuit; an output amplifier circuit; a control circuit; an input terminal for receiving an input of an input signal; an output terminal for output of an output signal; a first power supply terminal supplied with a first power supply voltage; a second power supply terminal supplied with a second power supply voltage; and a third power supply terminal supplied with a third power supply voltage having a voltage value between the first power supply voltage and the second power supply voltage, In this output circuit, the differential amplifier circuit includes: a differential input stage for producing differential currents corresponding to a difference between the input signal and the output signal; a first current mirror connected to the first power supply terminal and including a transistor pair of a first conductivity type; a second current mirror connected to the second power supply terminal and including a transistor pair of a second conductivity type having a conductivity type opposite to the first conductivity type; a first current source circuit connected between an input node of the first current mirror and an input node of the second current mirror; and a second current source circuit connected between an output node of the first current mirror and an output node of the second current mirror, at least one of the first and second current mirrors receiving the differential currents of the differential input stage. The first current source circuit includes: a first transistor of the first conductivity type with a control terminal for receiving a first bias voltage; and a second transistor of the second conductivity type that is connected in series to the first transistor and has a control terminal for receiving a second bias voltage. The output amplifier circuit includes: a third transistor of the first conductivity type connected between the first power supply terminal and the output terminal and having a control terminal connected to a connection point between the output node of the first current mirror and one end of the second current source circuit; and a fourth transistor of the second conductivity type connected between the third power supply terminal and the output terminal and having a control terminal connected to the other end of the second current source circuit. The control circuit includes a fifth transistor of the first conductivity type with a first terminal connected to a connection point between the other end of the second current source circuit and the control terminal of the fourth transistor in the output amplifier circuit and with a second terminal connected to the output node of the second current mirror, the control terminal receiving the first bias voltage.

Furthermore, an output circuit according to the present invention includes: a differential amplifier circuit; an output amplifier circuit; a control circuit; an input terminal for receiving an input of an input signal; an output terminal for output of an output signal; a first power supply terminal supplied with a first power supply voltage; a second power supply terminal supplied with a second power supply voltage; and a third power supply terminal supplied with a third power supply voltage having a voltage value between the first power supply voltage and the second power supply voltage. In this output circuit, the differential amplifier circuit includes: a differential input stage for producing differential currents corresponding to a difference between the input signal and the output signal; a first current mirror connected to the first power supply terminal and including a transistor pair of a first conductivity type; a second current mirror connected to the second power supply terminal and including a transistor pair of a second conductivity type having a conductivity type opposite to the first conductivity type; a first current source circuit connected between an input node of the first current mirror and an input node of the second current mirror; and a second current source circuit connected between an output node of the first current mirror and an output node of the second current mirror, at least one of the first and second current mirrors receiving the differential currents of the differential input stage. The first current source circuit includes: a first transistor of the first conductivity type with a control terminal for receiving a first bias voltage; and a second transistor of the second conductivity type that is connected in series to the first transistor and has a control terminal for receiving a second bias voltage. The output amplifier circuit includes: a third transistor of the first conductivity type connected between the third power supply terminal and the output terminal and having a control terminal connected to one end of the second current source circuit; and a fourth transistor of the second conductivity type connected between the second power supply terminal and the output terminal and having a control terminal connected to a connection point between the output node of the second current mirror and the other end of the second current source circuit. The control circuit includes a fifth transistor of the second conductivity type with a first terminal connected to a connection point between the one end of the second current source circuit and the control terminal of the third transistor in the output amplifier circuit and with a second terminal connected to the output node of the first current mirror and with a control terminal receiving the second bias voltage.

BRIEF DESCRIPTION OF THE DRAWINGS

The features of the present invention will be described in the following description with reference to the accompanying drawings in which.

DETAILED DESCRIPTION OF THE INVENTION

A description will next be given of embodiments of the present invention with reference to the drawings. Note that in the descriptions and attached drawings of each embodiment below, substantially the same or equivalent parts will be denoted with the same reference symbols.

First Embodiment

Figure 1:
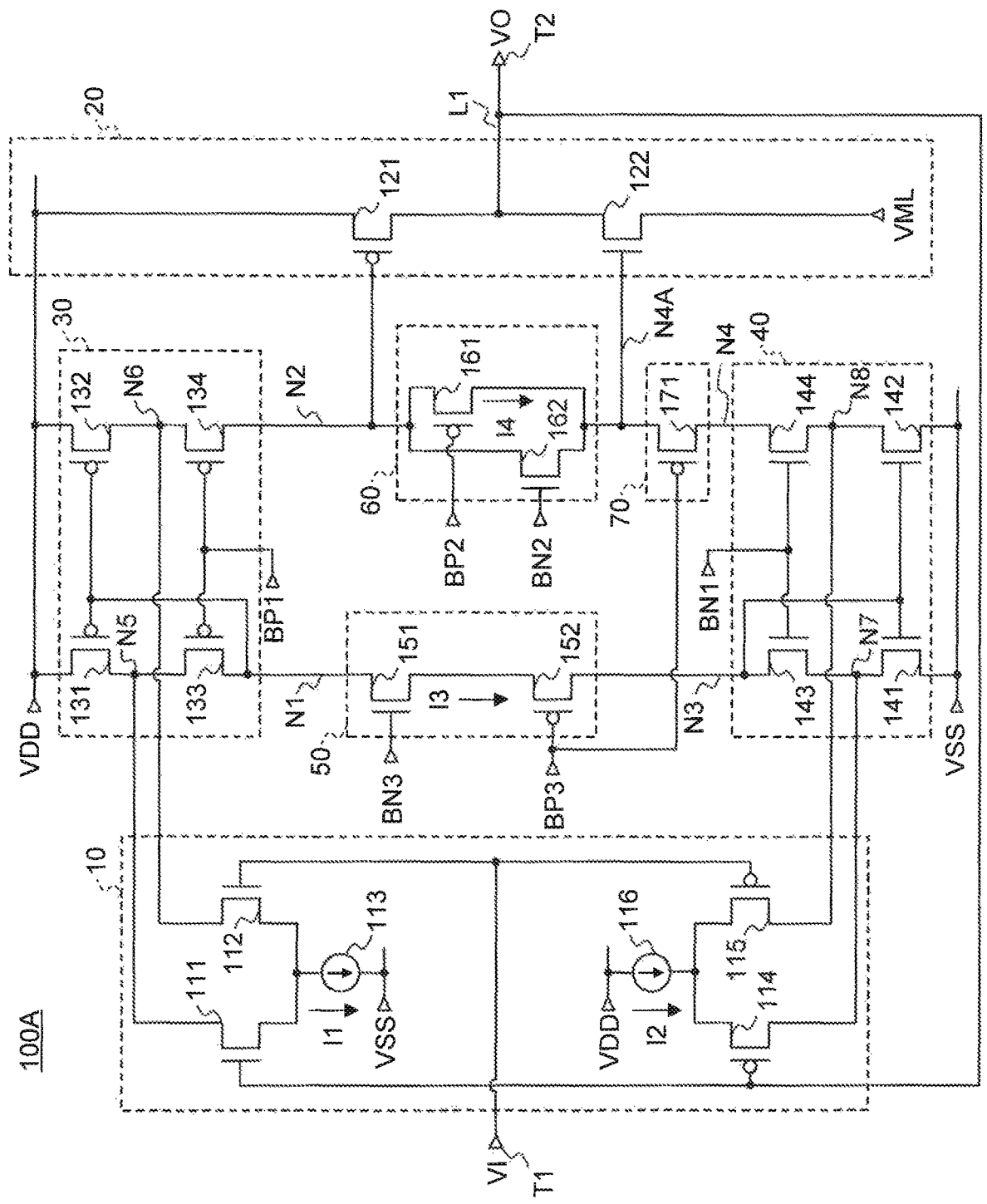
FIG. 1 is a circuit diagram illustrating a configuration of an output circuit according to a first embodiment.

FIG. 1 is a view illustrating a configuration of an output circuit 100A according to a first embodiment of the present invention. The output circuit 100A includes a differential input stage 10, an output amplifier circuit 20, a first current mirror circuit 30, a second current mirror circuit 40, a first floating current source circuit 50, a second floating current source circuit 60, and a control circuit 70. The differential input stage 10, the first current mirror circuit 30, the second current mirror circuit 40, the first floating current source circuit 50, and the second floating current source circuit 60 constitute a differential amplifier circuit.

Furthermore, the output circuit 100A has an input terminal T1 connected to the differential input stage 10, an output terminal T2 connected to the output amplifier circuit 20, and each power supply terminal to be supplied with a high level power supply voltage VDD, a middle level power supply voltage VML, and a low level power supply voltage VSS. The middle level power supply voltage VML has a middle voltage value between the high level power supply voltage VDD and the low level power supply voltage VSS.

The differential input stage 10 is configured from a constant-current source 113, an Nch differential pair of NMOS transistors 111 and 112, a constant-current source 116, and a Pch differential pair of PMOS transistors 114 and 115.

The drains of the NMOS transistors 111 and 112 acting as the output of the Nch differential pair are connected to a connection node N5 between PMOS transistors 131 and 133 and to a connection node N6 between PMOS transistors 132 and 134, respectively. The drains of the PMOS transistors 114 and 115 acting as the output of the Pch differential pair are connected to a connection node N7 between NMOS transistors 141 and 143 and to a connection node N8 between NMOS transistors 142 and 144, respectively.

The constant-current source 113 has one end connected to a VSS power supply terminal. The NMOS transistors 111 and 112 constituting the Nch differential pair have sources connected together to the other end of the constant-current source 113. The gate of the NMOS transistor 111 is connected to the output terminal T2, and the gate of the NMOS transistor 112 is connected to the input terminal T1.

The constant-current source 116 has one end connected to a VDD power supply terminal. The PMOS transistors 114 and 115 constituting the Pch differential pair have sources connected together to the other end of the constant-current source 116. The gate of the PMOS transistor 114 is connected to the gate of the NMOS transistor 111 and the output terminal T2. The gate of the PMOS transistor 115 is connected to the gate of the NMOS transistor 112 and the input terminal T1.

The output amplifier circuit 20 is configured from a PMOS transistor 121 and an NMOS transistor 122 which are connected in series between the VDD power supply terminal and a VML power supply terminal. The PMOS transistor 121 has the source connected to the VDD power supply terminal, the drain connected to the output terminal T2, and the gate connected to an output node N2 of the first current mirror circuit 30 and to one end of the second floating current source circuit 60. The NMOS transistor 122 has the source connected to the VML power supply terminal, the drain connected to the drain of the PMOS transistor 121 and to the output terminal T2, and the gate connected to the other end of the second floating current source circuit 60 and one end of the control circuit 70.

The first current mirror circuit 30 is configured from the PMOS transistors 131, 132, 133, and 134. The first current mirror circuit 30 is a low-voltage cascode current mirror of a typical PMOS configuration.

The PMOS transistors 131 and 132 have the gates connected to each other, and the sources connected together to the VDD power supply terminal.

The PMOS transistors 133 and 134 have the gates connected to each other. The source of the PMOS transistor 133 is connected to the drain of the PMOS transistor 131 via the node N5, while the source of the PMOS transistor 134 is connected to the drain of the PMOS transistor 132 via the node N6. The gates of the PMOS transistors 131 and 132 are connected together to the drain of the PMOS transistor 133 at a node N1. The gates of the PMOS transistors 133 and 134 are supplied with a bias voltage BP1.

The second current mirror circuit 40 is configured from the NMOS transistors 141, 142, 143, and 144. The second current mirror circuit 40 is a low-voltage cascode current mirror of a typical NMOS configuration.

The NMOS transistors 141 and 142 have the gates connected to each other and the sources connected together to the VSS power supply terminal.

The NMOS transistors 143 and 144 have the gates connected to each other. The source of the NMOS transistor 143 is connected to the drain of the NMOS transistor 141 via the node N7, and the source of the NMOS transistor 144 is connected to the drain of the NMOS transistor 142 via the node N8. The gates of the NMOS transistors 141 and 142 are connected together to the drain of the NMOS transistor 143 at a node N3. The gates of the NMOS transistors 143 and 144 are supplied with a bias voltage BN1.

The first floating current source circuit 50 is configured from an NMOS transistor 151 and a PMOS transistor 152, which are connected to each other in series, with the sources being connected to each other.

The drain of the NMOS transistor 151 is connected to the drain of the PMOS transistor 133 via the input node N1 of the first current mirror circuit 30. The drain of the PMOS transistor 152 is connected to the drain of the NMOS transistor 143 via the input node N3 of the second current mirror circuit 40. The gate of the NMOS transistor 151 is supplied with a bias voltage BN3. The gate of the PMOS transistor 152 is supplied with a bias voltage BP3.

The second floating current source circuit 60 is configured from a PMOS transistor 161 and an NMOS transistor 162 connected in parallel to each other. The second floating current source circuit 60 is connected between the output node N2 of the first current mirror circuit 30 and an output node N4 of the second current mirror circuit 40.

The source of the PMOS transistor 161 and the drain of the NMOS transistor 162 are connected to the drain of the PMOS transistor 134 via the output node N2 of the first current mirror circuit 30. The drain of the PMOS transistor 161 and the source of the NMOS transistor 162 are connected to the drain of the NMOS transistor 144 via the control circuit 70 and the output node N4 of the second current mirror circuit 40. The gate of the PMOS transistor 161 is supplied with a bias voltage BP2. The gate of the NMOS transistor 162 is supplied with a bias voltage BN2.

The control circuit 70 is configured from a PMOS transistor 171. The source of the PMOS transistor 171 is connected to a connection node N4A for connecting between the other end of the second floating current source circuit 60 and the gate of the NMOS transistor 122. The drain of the PMOS transistor 171 is connected to the drain of NMOS transistor 144 via the output node N4 of the second current mirror circuit 40. The gate of the PMOS transistor 171 is connected to the gate of the PMOS transistor 152 of the first floating current circuit 50 and is supplied with the bias voltage BP3.

The bias voltage BP3 is a voltage signal depending on the middle level power supply voltage VML, and more specifically, is a voltage lower than the middle level power supply voltage VML approximately by the absolute value (|Vtp|) of the threshold voltage of a PMOS transistor (i.e., VML−|vtp|). The bias voltage BP3 is supplied, as a common bias voltage, to the gate of the PMOS transistor 171 of the control circuit 70 and the gate of the PMOS transistor 152 of the first floating current circuit 50.

A description will next be given of the operation of the output circuit 100A of this embodiment.

For high-speed driving (the column inversion driving) of a heavy capacitive load such as data lines of a large-screen liquid crystal display device, for example, in the initial state in which a positive voltage around the middle level power supply voltage VML has been input to the input terminal T1, a positive voltage around the high level power supply voltage VDD is input to the input terminal T1 of the output circuit 100A at a start of one data period. In this case, an output line L1 connecting between the output terminal T2 and a connection end between the PMOS transistor 121 and the NMOS transistor 122 is charged. More specifically, an output voltage VO at the output terminal T2 immediately after the start of one data period is a positive voltage around the middle level power supply voltage VML in the initial state, and an input signal VI at the input terminal T1 is changed to a positive voltage around the high level power supply voltage VDD. This causes the differential currents flowing through the NMOS transistors 112 and 111 in the Nch differential pair, to which the input voltage VI and the output voltage VO are applied, to be increased and decreased, respectively. The differential currents flowing through the PMOS transistors 115 and 114 in the Pch differential pair, to which the input voltage VI and the output voltage VO are applied, to be decreased and increased, respectively.

The potential at the node N5 of the first current mirror circuit 30 is increased due to the decrease in the current through the NMOS transistor 111, and accordingly, the potential at the input node N1 of the first current mirror circuit 30 is increased. The increase in the potential at the input node N1 in turn causes both the currents through the PMOS transistors 131 and 132 to be decreased. Furthermore, since the current through the NMOS transistor 112 is increased, the potential at the node N6 is lowered and the current through the PMOS transistor 134 is decreased or interrupted. This causes the potential at the output node N2 of the first current mirror circuit 30, that is, the potential of the gate of the PMOS transistor 121 to be reduced to a lower voltage. The potential at the node N4A, that is, the potential of the gate of the NMOS transistor 122 is also lowered via the current source circuit 60.

On the other hand, the potential at the node N7 of the second current mirror circuit 40 is increased due to the increase in the current through the PMOS transistor 114, and accordingly, the potential at the input node N3 of the second current mirror circuit 40 is also increased. The increase in the potential at the input node N3 causes both the currents through the NMOS transistors 141 and 142 to be increased. Furthermore, since the current through the PMOS transistor 115 is decreased, the potential at the node N8 is lowered, and the current through the NMOS transistor 144 is increased. This causes the potential at the output node N4 of the second current mirror circuit 40 to be reduced to a lower voltage. Furthermore, the potential at the node N4A, that is, the potential of the gate of the NMOS transistor 122 is also lowered via the PMOS transistor 171 of the current control circuit 70. Furthermore, the potential at the node N2, that is, the gate of the PMOS transistor 121 is also lowered via the current source circuit 60.

As described above, the output current from the first current mirror circuit 30 is decreased or interrupted depending on the differential currents through the Nch differential pair (112, 111), thereby causing the gate potential of the PMOS transistor 121 and the gate potential of the NMOS transistor 122 to be lowered. On the other hand, the output current from the second current mirror circuit 40 is increased depending on the differential currents through the Pch differential pair (115, 114), thereby causing the gate potential of the PMOS transistor 121 and the gate potential of the NMOS transistor 122 to be lowered. This causes the current through the PMOS transistor 121 of the output amplifier circuit 20 to be increased, and the current through the NMOS transistor 122 to be decreased or interrupted. Furthermore, the output terminal T2 being charged causes an increase in the output voltage VO. Note that even the differential input stage 10 of FIG. 1 configured from only one of the Nch differential pair (112, 111) and the Pch differential pair (115, 114) also contributes to variations in the gate potential of the PMOS transistor 121 and the gate potential of the NMOS transistor 122, and thus provide the same actions as those of the configuration with both the differential pairs.

Here, when the gate potential of the NMOS transistor 122 in the output amplifier circuit 20 (i.e., the potential at the connection node N4A) is to be further lowered from the middle level power supply voltage VML (i.e., the source potential of the PMOS transistor 171 is to be lowered from the middle level power supply voltage VML), the PMOS transistor 171 is turned off at the point at which the voltage between the gate and the source of the PMOS transistor 171 is equal to or less than a threshold voltage. This interrupts the current path between the high level power supply voltage VDD and the low level power supply voltage VSS (the current flowing through the PMOS transistors 132 and 134, the second floating current source circuit 60, the PMOS transistor 171, and the NMOS transistors 144 and 142).

Thus, the potential at the connection node N4A is retained at around the middle level power supply voltage VML, and is not reduced below the middle level power supply voltage VML. Furthermore, the gate potential of the PMOS transistor 121 of the output amplifier circuit 20 is not reduced below the middle level power supply voltage VML. That is, the PMOS transistor 171 is turned off, thereby preventing the gate potential of the PMOS transistor 121 and the NMOS transistor 122 of the output amplifier circuit 20 from deviating from a positive supply voltage range (between the high level power supply voltage VDD and the middle level power supply voltage VML.)

In this state, when the process proceeds to the next one data period and a positive voltage around the middle level power supply voltage VML is input to the input terminal T1, the process is immediately changed so as to discharge the output line L1. More specifically, when the input signal VI to the input terminal T1 is changed to a positive voltage around the middle level power supply voltage VML, the differential currents through the NMOS transistors 112 and 111 in the Nch differential pair, to which the input voltage VI and the output voltage VO are applied, are decreased and increased, respectively. The differential currents through the PMOS transistors 115 and 114 in the Pch differential pair, to which the input voltage VI and the output voltage VO are applied, are increased and decreased, respectively.

The potential at the node N5 of the first current mirror circuit 30 is lowered due to the increase in the current through the NMOS transistor 111, and accordingly, the potential at the input node N1 of the first current mirror circuit 30 is also lowered. The potential lowered at the input node N1 causes both the currents through the PMOS transistors 131 and 132 to be increased. Furthermore, since the current through the NMOS transistor 112 is decreased, the potential at the node N6 is increased, and the current through the PMOS transistor 134 is increased. This in turn causes the potential at the output node N2 of the first current mirror circuit 30, that is, the potential of the gate of the PMOS transistor 121 to be increased toward a higher voltage. Furthermore, the potential at the node N4A, that is, the potential of the gate of the NMOS transistor 122 is also increased via the current source circuit 60.

On the other hand, the potential at the node N7 of the second current mirror circuit 40 is lowered due to the decrease in the current through the PMOS transistor 114, and accordingly, the potential at the input node N3 of the second current mirror circuit 40 is also lowered. The decrease in the potential at the input node N3 causes both the currents through the NMOS transistors 141 and 142 to be decreased. Furthermore, since the current through the PMOS transistor 115 is increased, the potential at the node N8 is increased, and the current through the NMOS transistor 144 is decreased or interrupted. This in turn causes the potential at the output node N4 of the second current mirror circuit 40 to be increased toward a higher voltage. Furthermore, the potential at the node N4A, that is, the potential of the gate of the NMOS transistor 122 is also increased via the PMOS transistor 171 of the current control circuit 70. Furthermore, the potential at the node N2, that is, the potential of the gate of the PMOS transistor 121 is also increased via the current source circuit 60.

As described above, the output current from the first current mirror circuit 30 is increased depending on the differential currents through the Nch differential pair (112, 111) and the output current from the second current mirror circuit 40 is decreased or interrupted depending on the differential currents through the Pch differential pair (115, 114), thereby causing the node N2 and the node N4A to be increased together. Thus, even when the potentials at the node N2 and the node N4A have not yet been fully returned to a stable output state in the previous one data period, the potentials are immediately increased to a potential at the time of the stable output state so long as the potentials lie within the positive supply voltage range. Furthermore, the potentials at the node N2 and the node N4A are increased, and the PMOS transistor 121 is turned off and the NMOS transistor 122 is turned on (in a conducting state). This causes the output line L1 to immediately start to be discharged to around the middle level power supply voltage VML.

Note that even the differential input stage 10 of FIG. 1 configured from only one of the Nch differential pair (112, 111) or the Pch differential pair (115,114) also contributes to variations in the gate potential of the PMOS transistor 121 and the gate potential of the NMOS transistor 122, and thus provide the same actions as those of the configuration with both the differential pairs.

From the foregoing, in the output circuit 100A of this embodiment, the PMOS transistor 171 of the control circuit 70 acts as a clamp element so as to prevent the gate voltages of the transistors 121 and 122 in the output stage (the output amplifier circuit 20) from deviating from the positive supply voltage range, thereby avoiding a delay of an output signal.

Furthermore, in the first floating current source circuit 50, the sources of the NMOS transistor 151 and the PMOS transistor 152 are connected to each other; the drain of the NMOS transistor 151 is connected to the input node N1 of the first current mirror circuit 30; and the drain of the PMOS transistor 152 is connected to the input node N3 of the second current mirror circuit 40. The gates of the transistors 151 and 152 are supplied with the bias voltages BN3 and BP3, respectively, which are produced, for example, on the basis of the middle level power supply voltage VML so as to provide control so that the common source of the transistors 151 and 152 is at a potential around the middle level power supply voltage VML. According to this configuration, the first floating current source circuit 50 is capable of performing a stable amplifier operation even in the presence of a power supply noise in the high level power supply voltage VDD, the low level power supply voltage VSS, or the middle level power supply voltage VML. More specifically, in the case of a significant voltage decrease (or a voltage drop) in the high level power supply voltage VDD, there occurs a voltage drop in the potential at the input node N1 of the first current mirror circuit 30. However, since the gate voltage and the source potential of the NMOS transistor 151 do not depend on a variation in the potential of the drain (the node N1), it is possible to flow a stable constant current even in the presence of a variation at the node N1. Likewise, since the gate voltage and the source potential of the PMOS transistor 152 do not depend on a variation in the potential of the drain (the node N3), it is possible to flow a stable constant current even in the presence of a variation at the node N3 caused by a power supply noise at the low level power supply voltage VSS. On the other hand, even in the presence of a variation in the bias voltages BN3 and BP3 due to a power supply noise at the middle level power supply voltage VML, it is possible to flow a stable constant current because the common source of the transistors 151 and 152 follows the variation. Thus, the output circuit 100A with the first floating current source circuit 50 is capable of performing a stable amplifier operation all the time.

Furthermore, in the output circuit 100A of this embodiment, the gate of the PMOS transistor 152 in the first floating current source circuit 50 and the gate of the PMOS transistor 171 in the control circuit 70 are connected together and are supplied with the common bias voltage BP3. Thus, the number of bias signals (bias lines) can be reduced as compared with the case where the PMOS transistor 152 of the first floating current source circuit 50 and the PMOS transistor 171 of the control circuit 70 are supplied with a separate bias voltage.

Figure 2:
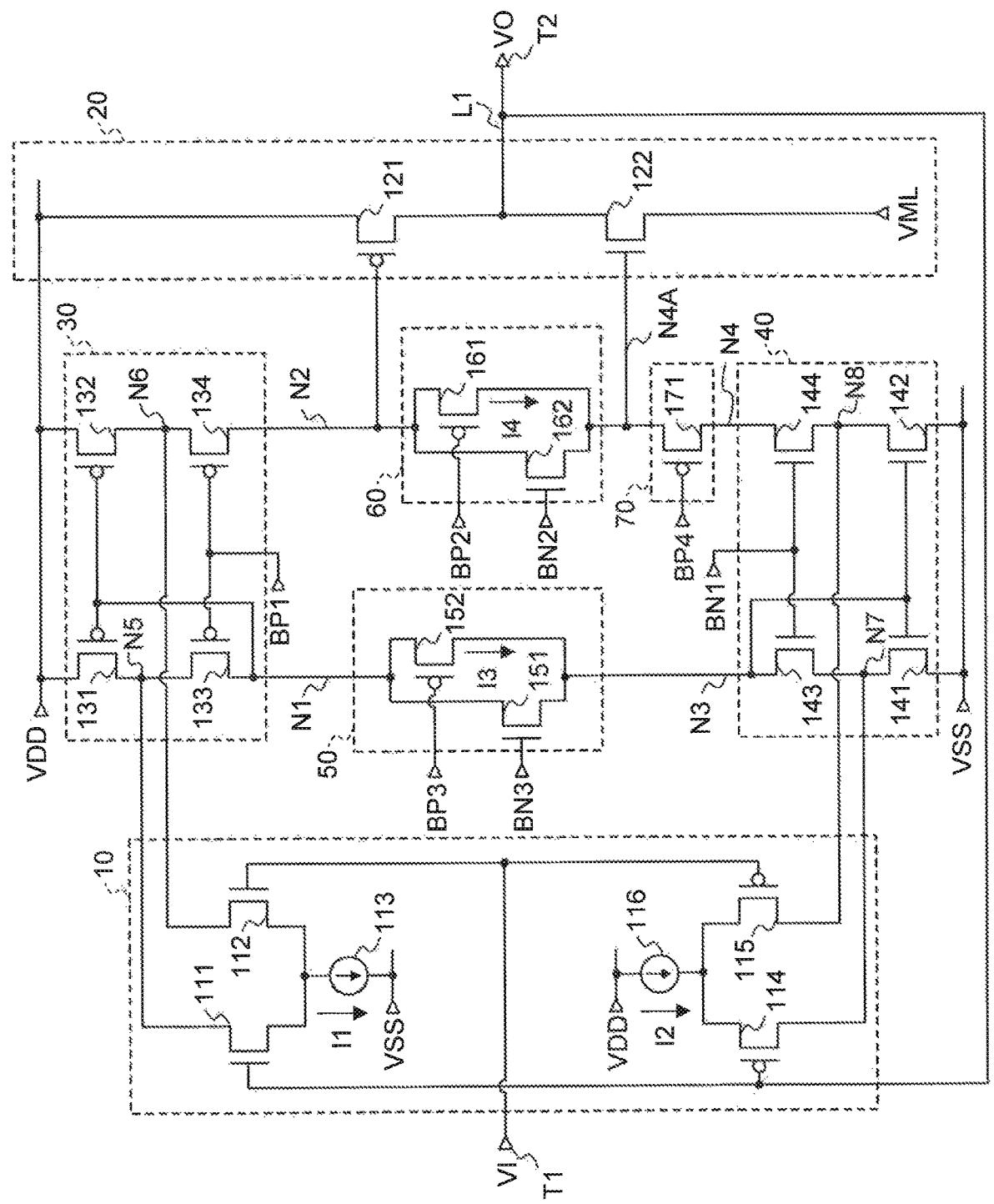
FIG. 2 is a circuit diagram illustrating a comparative example of the output circuit.

FIG. 2 is a view illustrating an output circuit as a comparative example. Unlike the output circuit 100A of this embodiment, the first floating current source circuit 50 has the same configuration as that of the second floating current source circuit 60. That is, the NMOS transistor 151 and the PMOS transistor 152 are connected in parallel between the input node N1 of the first current mirror circuit 30 and the input node N3 of the second current mirror circuit 40. In this configuration, when the potential at the node N1 is varied due to a noise in the high level power supply voltage VDD, a variation in the current to be controlled by the PMOS transistor 152 with the source connected to the node N1 would lead to an abnormal amplifier operation. Likewise, when the potential at the node N3 is varied due to a noise of the low level power supply voltage VSS, a variation in the current to be controlled by the NMOS transistor 151 with the source connected to the node N3 would lead to an abnormal amplifier operation. Furthermore, the gate of the PMOS transistor in the control circuit 70 is supplied with a bias voltage BP4, which is based on the middle level power supply voltage VML and different from the bias voltage BP3 supplied to the PMOS transistor 152 of the first floating current source circuit 50. Thus, there are a more number of bias signals as compared with the output circuit 100A of this embodiment.

As described above, according to the output circuit 100A of this embodiment, it is possible to implement a stable amplifier operation which is impervious to a variation such as a power supply noise. Furthermore, since the bias voltage supplied to the gate of the PMOS transistor 152 in the first floating current source circuit 50 and the bias voltage supplied to the gate of the PMOS transistor 171 in the control circuit 70 are in common, it is possible to reduce the number of bias signals (bias lines). The reduction of bias signals decreases the risk of noise influences caused, for example, by coupling with crossing conductor traces and improves the ease of design.

Second Embodiment

Figure 3:
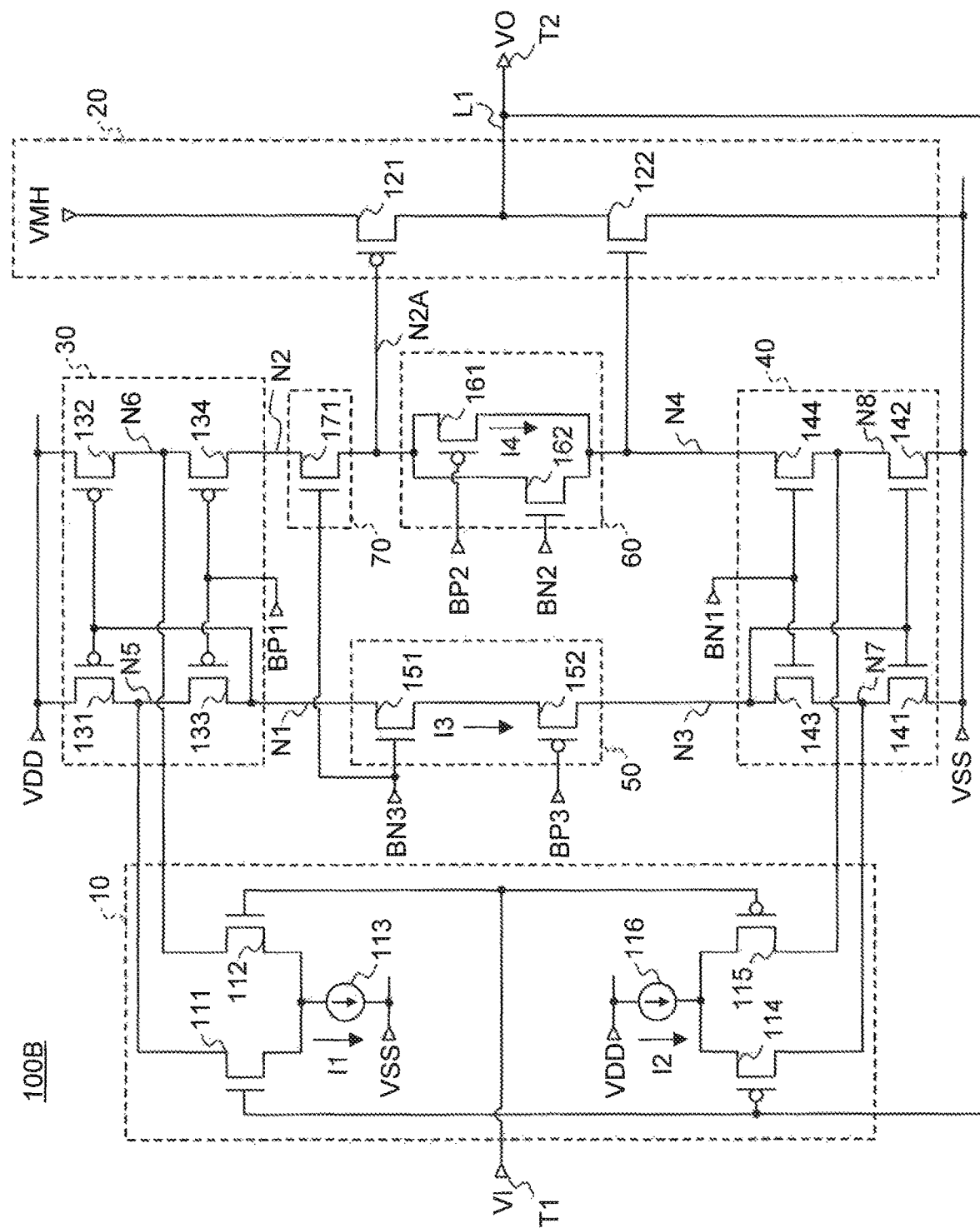
FIG. 3 is a circuit diagram illustrating a configuration of an output circuit according to a second embodiment.

FIG. 3 is a view illustrating a configuration of an output circuit 100B according to a second embodiment of the present invention. The output circuit 100B includes the differential input stage 10, the output amplifier circuit 20, the first current mirror circuit 30, the second current mirror circuit 40, the first floating current source circuit 50, the second floating current source circuit 60, and the control circuit 70.

Furthermore, the output circuit 100B has the input terminal T1 connected to the differential input stage 10, the output terminal T2 connected to the output amplifier circuit 20, and each power supply terminal to which a high level power source VDD, a middle level power source VMH, and a low level power source VSS are applied. The middle level power source VMH provides a voltage having an intermediate voltage value between the high level power source VDD and the low level power source VSS.

The output circuit 100B of this embodiment is different from the output circuit 100A of the first embodiment in the configuration of the output amplifier circuit 20 and the control circuit 70. The differential input stage 10, the first current mirror circuit 30, the second current mirror circuit 40, the first floating current circuit 50, and the second floating current circuit 60 are configured in the same manner as in the output circuit 100A of the first embodiment, and will not be repeatedly described.

The output amplifier circuit 20 is configured from the PMOS transistor 121 and the NMOS transistor 122 which are connected in series between the VMH power supply terminal and the VSS power supply terminal. The PMOS transistor 121 has the source connected to the VMH power supply terminal, the drain connected to the output terminal T2, and the gate connected to one end of the second floating current source circuit 60 and the other end of the control circuit 70. The NMOS transistor 122 has the source connected to the VSS power supply terminal, the drain connected to the drain of the PMOS transistor 121 and the output terminal T2, and the gate connected to the output node N4 of the second current mirror circuit 40 and the other end of the second floating current source circuit 60.

The control circuit 70 is configured from an NMOS transistor 171. The source of the NMOS transistor 171 is connected to a connection node N2A for connecting between one end of the second floating current source circuit 60 and the gate of the PMOS transistor 121. The drain of the NMOS transistor 171 is connected to the drain of the PMOS transistor 134 via the output node N2 of the first current mirror circuit 30. The gate of the NMOS transistor 171 is connected to the gate of the NMOS transistor 151 in the first floating current circuit 50 and supplied with the bias voltage BN3.

The bias voltage BN3 is a voltage signal depending on the middle level power source VMH and is higher than the voltage of the middle level power source VMH approximately by the threshold voltage (Vth) of the NMOS transistor (i.e., VMH+Vth). The bias voltage BN3 is supplied, as a common bias voltage, to the gate of the NMOS transistor 171 in the control circuit 70 and the gate of the NMOS transistor 151 in the first floating current source circuit 50.

A description will next be given of the operation of the output circuit 100B of this embodiment.

For high-speed driving (the column inversion driving) of a heavy capacitive load such as data lines of a large-screen liquid crystal display device, for example, in the initial state in which a negative voltage around the middle level power supply voltage VMH has been input to the input terminal T1, a negative voltage around the low level power supply voltage VSS is input to the input terminal T1 of the output circuit 100B at a start of one data period. In this case, the output line L1 connecting between the output terminal T2 and the connection end between the PMOS transistor 121 and the NMOS transistor 122 is discharged. More specifically, the output voltage VO at the output terminal T2 immediately after the start of one data period is a negative voltage around the middle level power supply voltage VMH in the initial state, and the input signal VI at the input terminal T1 is changed to a negative voltage around the low level power supply voltage VSS. This causes the differential currents flowing through the NMOS transistors 112 and 111 in the Nch differential pair, to which the input voltage VI and the output voltage VO are applied, to be decreased and increased, respectively. Likewise, the differential currents flowing through the PMOS transistors 115 and 114 in the Pch differential pair, to which the input voltage VI and the output voltage VO are applied, are increased and decreased, respectively. The action of the current mirror circuits 30 and 40 is the same as the action of those of the output circuit 100A (FIG. 1). The output current from the first current mirror circuit 30 is increased depending on the differential currents of the Nch differential pair (112, 111), and the output current from the second current mirror circuit 40 is decreased or interrupted depending on the differential currents of the Pch differential pair (115, 114), thereby causing both the nodes N2 and N4 to be increased. The node N2A connected to the nodes N2 and N4 via the control circuit 70 and the second floating current source circuit 60, respectively, is also increased. This causes the current through the PMOS transistor 121 in the output amplifier circuit 20 with the gate connected to the node N2A to be decreased or interrupted, and the current through the NMOS transistor 122 in the output amplifier circuit 20 with the gate connected to the node N4 to be increased. Discharging the output terminal T2 leads to a drop in the output voltage VO.

Here, when the gate potential of the PMOS transistor 121 in the output amplifier circuit 20 (i.e., the potential at the connection node N2A) is to be further increased from the middle level power supply voltage VMH (i.e., the source potential of the NMOS transistor 171 is to be increased from the middle level power supply voltage VMH), the NMOS transistor 171 is turned off at the point at which the voltage between the gate and the source of the NMOS transistor 171 is equal to or less than a threshold voltage. This interrupts the current path between the high level power supply voltage VDD and the low level power supply voltage VSS (the current flowing through the PMOS transistors 132, and 134, the NMOS transistor 171, the second floating current source circuit 60, and the NMOS transistors 144 and 142.)

Thus, the potential at the connection node N2A is retained at around the middle level power supply voltage VMH and not increased above the middle level power supply voltage VMH. Furthermore, the gate potential of the NMOS transistor 122 in the output amplifier circuit 20 is not increased above the middle level power supply voltage VMH. That is, the NMOS transistor 171 is turned off, thereby preventing the gate potential of the PMOS transistor 121 and the NMOS transistor 122 in the output amplifier circuit 20 from deviating from the negative supply voltage range (between the low level power supply voltage VSS and the middle level power supply voltage VMH.)

In this state, when the process proceeds to the next one data period and a negative voltage around the middle level power supply voltage VMH is input to the input terminal T1, the process is immediately changed to charge the output line L1. More specifically, when the input signal VI to the input terminal T1 is changed to a negative voltage around the middle level power supply voltage VMH, the differential currents through the NMOS transistors 112 and 111 in the Nch differential pair, to which the input voltage VI and the output voltage VO are applied, are increased and decreased, respectively, while the differential currents through the PMOS transistors 115 and 114 in the Pch differential pair are decreased and increased, respectively. The current mirror circuits 30 and 40 provide the same actions as those of the output circuit 100A (FIG. 1). The output current from the first current mirror circuit 30 is decreased or interrupted depending on the differential currents of the Nch differential pair (112, 111), and the output current from the second current mirror circuit 40 is increased depending on the differential currents of the Pch differential pair (115, 114), thereby causing the nodes N2, N2A, and N4 to be lowered all together. Thus, even when the potentials at the node N2A and the node N4A have not yet been fully returned to a stable output state in the previous one data period, the potentials are immediately lowered to a potential at the time of the stable output state so long as the potentials lie within the negative supply voltage range. Furthermore, the potentials at the node N2A and the node N4 are lowered, and the NMOS transistor 122 is turned off and the PMOS transistor 121 is turned on (in a conducting state). This causes the output line L1 to immediately start to be charged to around the middle level power supply voltage VMH.

From the foregoing, in the output circuit 100B of this embodiment, the NMOS transistor 171 of the control circuit 70 acts as a clamp element to prevent the gate voltages of the transistors 121 and 122 in the output stage (the output amplifier circuit 20) from deviating from the negative supply voltage range, thereby avoiding a delay of an output signal.

Furthermore, like the output circuit 100A of the first embodiment, the first floating current source circuit 50 in the output circuit 100B of this embodiment is configured from the NMOS transistor 151 and the PMOS transistor 152, which are connected in series and of which sources are connected to each other. Thus, the output circuit 100B is capable of performing a stable amplifier operation even in the presence of a power supply noise at the high level power supply voltage VDD, the low level power supply voltage VSS, and the middle level power supply voltage VMH.

Furthermore, the gate of the NMOS transistor 151 in the first floating current source circuit 50 and the gate of the NMOS transistor 171 in the control circuit 70 are connected together and are supplied with the common bias voltage BN3. Thus, the number of bias signals (bias lines) can be reduced as compared with the case where the NMOS transistor 151 of the first floating current source circuit 50 and the NMOS transistor 171 of the control circuit 70 are supplied with a separate bias voltage. This reduces the risk of noise influences caused, for example, by coupling with crossing conductor traces and improves the ease of design.

Third Embodiment

Figure 4:
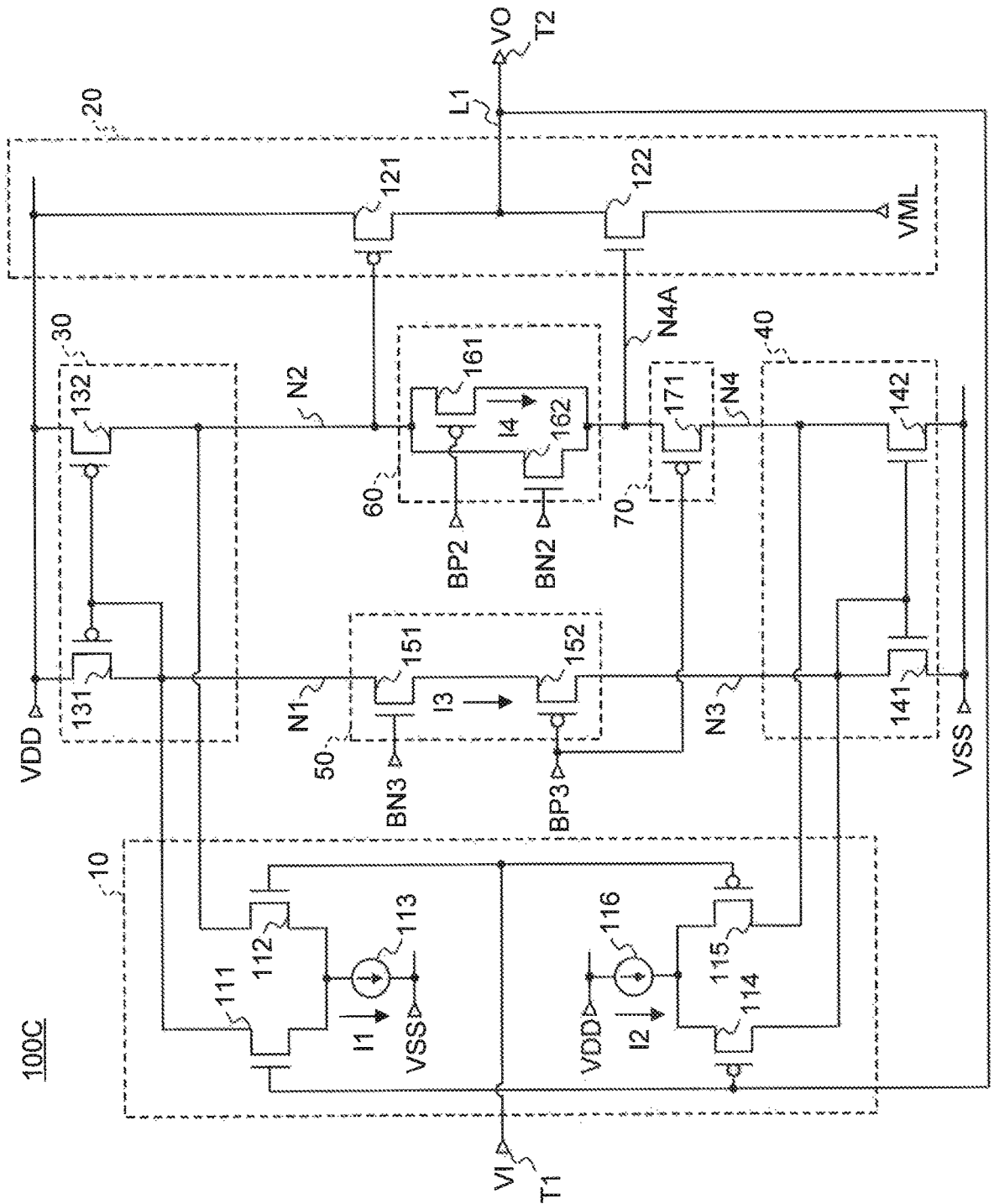
FIG. 4 is a circuit diagram illustrating a configuration of an output circuit according to a third embodiment.

FIG. 4 is a view illustrating a configuration of an output circuit 100C according to a third embodiment of the present invention. The output circuit 100C includes the differential input stage 10, the output amplifier circuit 20, the first current mirror circuit 30, the second current mirror circuit 40, the first floating current source circuit 50, the second floating current source circuit 60, and the control circuit 70.

The output circuit 100C of this embodiment is different from the output circuit 100A of the first embodiment in that the first current mirror circuit 30 and the second current mirror circuit 40 are not a low voltage cascode current mirror, unlike those of the first embodiment, but are configured from a one-stage current mirror.

The first current mirror circuit 30 is configured from the PMOS transistors 131 and 132. The PMOS transistors 131 and 132 have the gates connected to each other and the sources connected together to the VDD power supply terminal. Furthermore, the PMOS transistor 131 has the drain and the gate connected together. The drain of the PMOS transistor 131 is connected to one end of the first floating current source circuit 50 via the input node N1. The drain of the PMOS transistor 132 is connected to one end of the second floating current source circuit 60 via the output node N2.

The second current mirror circuit 40 is configured from the NMOS transistors 141 and 142. The NMOS transistors 141 and 142 have the gates connected to each other and the sources connected together to the VSS power supply terminal. Furthermore, the NMOS transistor 141 has the drain and the gate connected together. The drain of the NMOS transistor 141 is connected to the other end of the first floating current source circuit 50 via the input node N3. The drain of the NMOS transistor 142 is connected to the other end of the control circuit 70 via the output node N4.

A description will now be given of the operation of the output circuit 100C of this embodiment. For high-speed driving (the column inversion driving) of a heavy capacitive load such as data lines of a large-screen liquid crystal display device, for example, in the initial state in which a positive voltage around the middle level power supply voltage VML has been input to the input terminal T1, a positive voltage around the high level power supply voltage VDD is input to the input terminal T1 of the output circuit 100C at a start of one data period. In this case, the output line L1 connecting between the output terminal T2 and the connection end between the PMOS transistor 121 and the NMOS transistor 122 is charged. More specifically, the output voltage VO at the output terminal T2 immediately after the start of one data period is a positive voltage around the middle level power supply voltage VML in the initial state, and the input signal VI at the input terminal T1 is changed to a positive voltage around the high level power supply voltage VDD. This causes the differential currents flowing through the NMOS transistors 112 and 111 in the Nch differential pair, to which the input voltage VI and the output voltage VO are applied, to be increased and decreased, respectively. The differential currents flowing through the PMOS transistors 115 and 114 in the Pch differential pair, to which the input voltage VI and the output voltage VO are applied, are decreased and increased, respectively.

The potential at the input node N1 of the first current mirror circuit 30 is increased due to the decrease in the current through the NMOS transistor 111, and both the currents through the PMOS transistors 131 and 132 are decreased. Furthermore, since the current through the NMOS transistor 112 is increased, the potential at the output node N2 of the first current mirror circuit 30, that is, the potential of the gate of the PMOS transistor 121 is reduced to a lower voltage. Furthermore, the potential at the node N4A, that is, the gate of the NMOS transistor 122 is also lowered via the current source circuit 60.

On the other hand, the potential at the input node N3 of the second current mirror circuit 40 is increased due to the increase in the current through the PMOS transistor 114, and both the currents through the NMOS transistors 141 and 142 are increased. Furthermore, since the current through the PMOS transistor 115 is decreased, the potential at the output node N4 of the second current mirror circuit 40 is reduced to a lower voltage. Furthermore, the potential at the node N4A, that is, the potential of the gate of the NMOS transistor 122 is also lowered via the PMOS transistor 171 in the current control circuit 70. Furthermore, the potential at the node N2, that is, the potential of the gate of the PMOS transistor 121 is also lowered via the current source circuit 60. That is, the current mirror circuits 30 and 40 of this embodiment have a configuration different from that of the current mirror circuits 30 and 40 of the output circuit 100A, but provide the same actions. Furthermore, the control circuit 70 also provides the same action as that in the output circuit 100A. Thus, the output circuit 100C of this embodiment operates in the same manner as the output circuit 100A of the first embodiment and produces the same operative effects.

That is, in the charging operation on the output line L1, when the gate potential of the NMOS transistor 122 in the output amplifier circuit 20 (the potential at the connection node N4A) is to be further lowered from the middle level power supply voltage VML, the PMOS transistor 171 is turned off, interrupting the current path between the high level power supply voltage VDD and the low level power supply voltage VSS. The potential at the connection node N4A is retained at around the middle level power supply voltage VML, and is thus not to be reduced below the middle level power supply voltage VML. Thus, the gate voltages of the PMOS transistor 121 and the NMOS transistor 122 in the output amplifier circuit 20 (the output stage) are prevented from deviating from the positive supply voltage range (between the high level power supply voltage VDD and the middle level power supply voltage VML), and thus not to be reduced below the voltage level of the middle level power supply voltage VML. Thus, a delay of an output signal is avoided.

Furthermore, as in the first embodiment, the first floating current circuit 50 of this embodiment is configured from the NMOS transistor 151 and the PMOS transistor 152, which are connected in series and of which sources are connected to each other. Thus, it is possible to perform a stable amplifier operation even in the presence of a power supply noise in the high level power supply voltage VDD, the low level power supply voltage VSS, and the middle level power supply voltage VML.

Furthermore, the gate of the PMOS transistor 152 in the first floating current source circuit 50 and the gate of the PMOS transistor 171 in the control circuit 70 are connected together and are supplied with the common bias voltage BP3. Thus, the number of bias signals (bias lines) can be reduced as compared with the case where the PMOS transistor 152 of the first floating current source circuit 50 and the PMOS transistor 171 of the control circuit 70 are supplied with a separate bias voltage. Thus, this reduces the risk of noise influences caused, for example, by coupling with crossing conductor traces and improves the ease of design.

Fourth Embodiment

Figure 5:
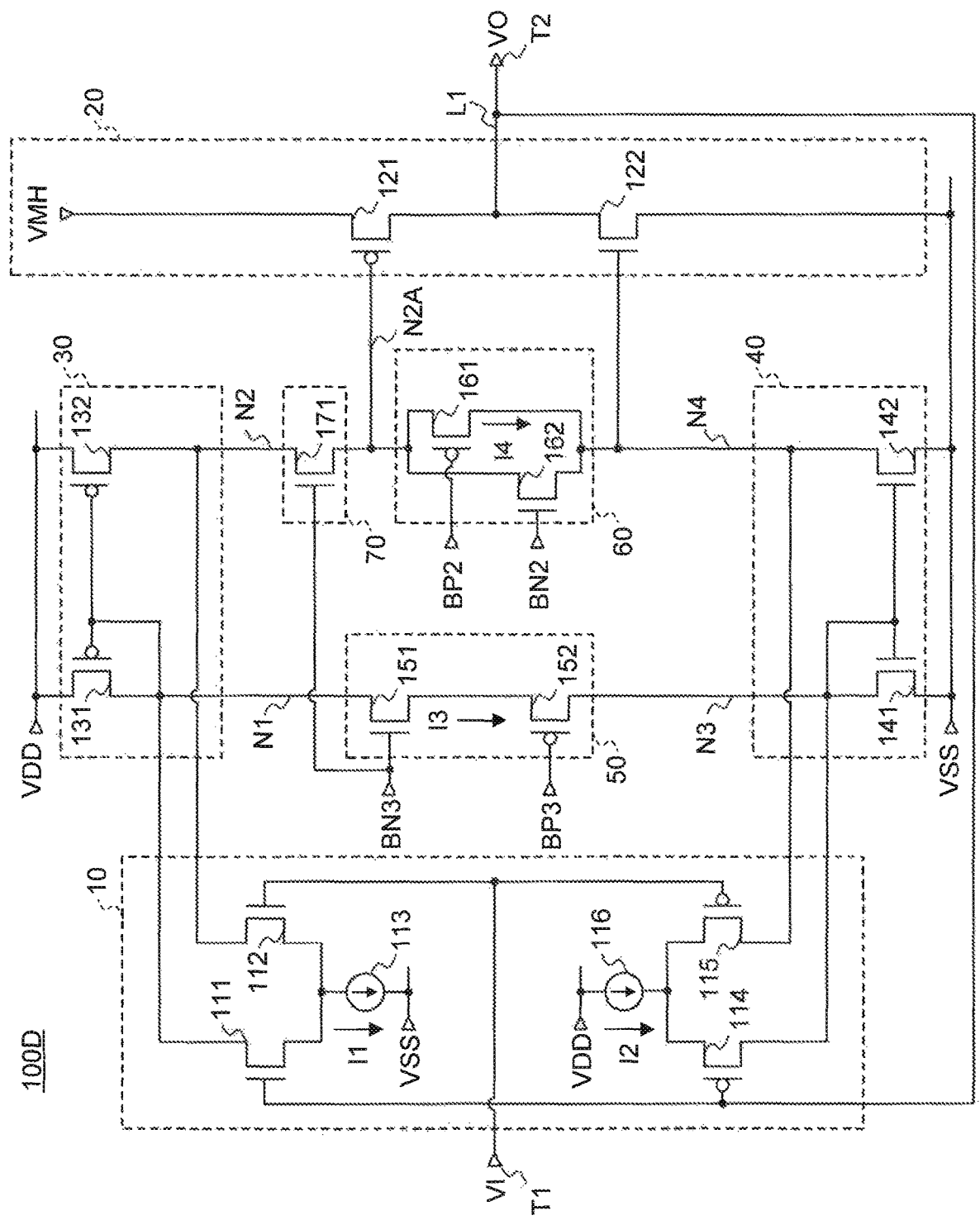
FIG. 5 is a circuit diagram illustrating a configuration of an output circuit according to a fourth embodiment.

FIG. 5 is a view illustrating a configuration of an output circuit 100D according to a fourth embodiment of the present invention. The output circuit 100D includes the differential input stage 10, the output amplifier circuit 20, the first current mirror circuit 30, the second current mirror circuit 40, the first floating current source circuit 50, the second floating current source circuit 60, and the control circuit 70.

The output circuit 100D of this embodiment is different from the output circuit 100B of the second embodiment in that the first current mirror circuit 30 and the second current mirror circuit 40 are not a low voltage cascode current mirror, unlike those of the second embodiment, but are configured from a one-stage current mirror.

The first current mirror circuit 30 is configured from the PMOS transistors 131 and 132. The PMOS transistors 131 and 132 have the gates connected to each other and the sources connected together to the VDD power supply terminal. Furthermore, the PMOS transistor 131 has the drain and the gate connected together. The drain of the PMOS transistor 131 is connected to one end of the first floating current source circuit 50 via the input node N1. The drain of the PMOS transistor 132 is connected to one end of the control circuit 70 via the output node N2.

The second current mirror circuit 40 is configured from the NMOS transistors 141 and 142. The NMOS transistors 141 and 142 have the gates connected to each other and the sources connected together to the VSS power supply terminal. Furthermore, the NMOS transistor 141 has the drain and the gate connected together. The drain of the NMOS transistor 141 is connected to the other end of the first floating current source circuit 50 via the input node N3. The drain of the NMOS transistor 142 is connected to the other end of the second floating current source circuit 60 via the output node N4.

The current mirror circuits 30 and 40 of this embodiment provide the same actions as those of the current mirror circuits 30 and 40 of the output circuit 100B. Furthermore, the control circuit 70 also provides the same action as that in the output circuit 100B. Thus, the output circuit 100D of this embodiment is operated in the same manner as the output circuit 100B of the second embodiment, and produces the same operative effects.

That is, when the gate potential of the PMOS transistor 121 in the output amplifier circuit 20 (the potential at the connection node N2A) is to be further increased from the middle level power supply voltage VMH, the NMOS transistor 171 is turned off to interrupt the current path between the high level power supply voltage VDD and the low level power supply voltage VSS. The potential at the connection node N2A is retained at around the middle level power supply voltage VMH and is not increased above the middle level power supply voltage VMH. Thus, the gate voltages of the PMOS transistor 121 and the NMOS transistor 122 in the output amplifier circuit 20 (the output stage) are prevented from deviating from the negative supply voltage range (between the low level power supply voltage VSS and the middle level power source VMH voltage), and will never be increased above the middle level power supply voltage VMH. Thus, a delay of an output signal is avoided.

Furthermore, as in the second embodiment, the first floating current circuit 50 of this embodiment is configured from the NMOS transistor 151 and the PMOS transistor 152, which are connected in series and of which sources are connected to each other. Thus, it is possible to perform a stable amplifier operation even in the presence of a power supply noise in the high level power supply voltage VDD, the low level power supply voltage VSS, and the middle level power supply voltage VMH.

Furthermore, the gate of the NMOS transistor 151 in the first floating current source circuit 50 and the gate of the NMOS transistor 171 in the control circuit 70 are connected together and are supplied with the common bias voltage BN3. Thus, the number of bias signals (bias lines) can be reduced as compared with the case where the NMOS transistor 151 of the first floating current source circuit 50 and the NMOS transistor 171 of the control circuit 70 are supplied with a separate bias voltage. Thus, this reduces the risk of noise influences caused, for example, by coupling with crossing conductor traces and improves the ease of design.

Fifth Embodiment

Figure 6:
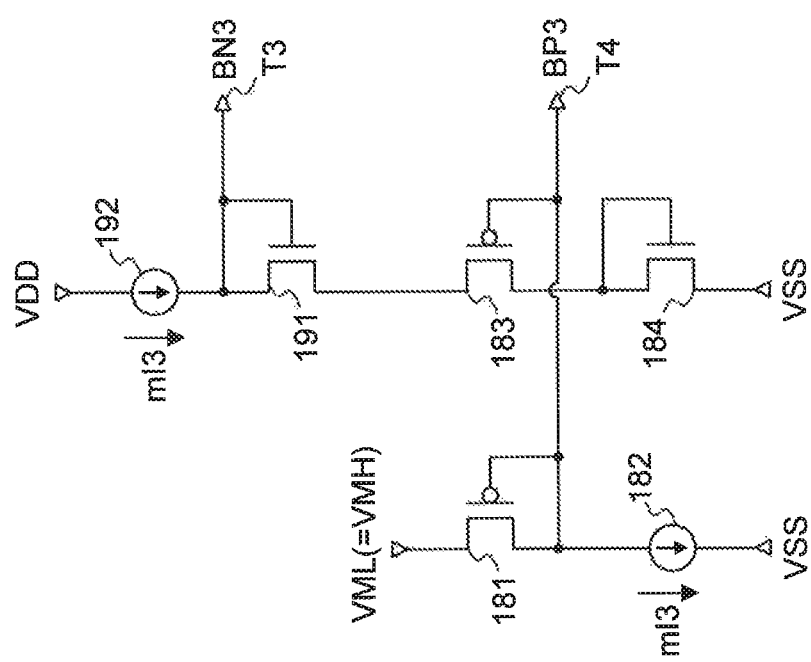
FIG. 6 is a circuit diagram illustrating a configuration of a bias circuit according to a fifth embodiment.

FIG. 6 is a view illustrating a configuration of a bias circuit 200A according to a fifth embodiment of the present invention. For example, the bias circuit 200A supplies the bias voltages BN3 and BP3 to the output circuit 100A (FIG. 1) of the first embodiment and the output circuit 100C (FIG. 4) of the third embodiment.

The bias circuit 200A includes a PMOS transistor 181, a constant-current source 182, a PMOS transistor 183, an NMOS transistor 184, an NMOS transistor 191, and a constant-current source 192.

The PMOS transistor 181 has the source connected to the VML power supply terminal and the drain connected to one end of the constant-current source 182. The gate and the drain of the PMOS transistor 181 are connected together and connected to an output terminal T4 for output of the bias voltage BP3.

The constant-current source 182 has one end connected to the drain of the PMOS transistor 181 and the other end connected to the VSS power supply terminal.

The PMOS transistor 183 has the source connected to the source of the NMOS transistor 191 and the drain connected to the drain of the NMOS transistor 184. The gate of the PMOS transistor 183 is connected to the output terminal T4 for output of the bias voltage BP3.

The NMOS transistor 184, which is a load element connected between the PMOS transistor 183 and the VSS power supply terminal, has the gate and the drain connected together to the drain of the PMOS transistor 183 and the source connected to the VSS power supply terminal.

The NMOS transistor 191 has the drain and the gate connected together and the source connected to the source of the PMOS transistor 183. The gate of the NMOS transistor 191 is connected to an output terminal T3 for output of the bias voltage BN3.

The constant-current source 192 has one end connected to the VDD power supply terminal and the other end connected to the drain of the NMOS transistor 191. The constant-current sources 182 and 192 are so set as to flow currents of an equal value mI3.

The bias circuit 200A outputs the voltage of the drain of the PMOS transistor 181 as the bias voltage BP3 and outputs the voltage of the drain of the NMOS transistor 191 as the bias voltage BN3. The bias voltage BP3 is produced on the basis of the middle level power supply voltage VML and is a voltage (VML−|Vtp|) that is lower than the voltage of the middle level power supply voltage VML approximately by the absolute value of the threshold voltage of the PMOS transistor 181 (|Vtp|).

Furthermore, the PMOS transistors 181 and 183 take on a gate voltage that is the bias voltage BP3, and the constant-current sources 182 and 192 provide currents of an equal value. Thus, the common source potential of the PMOS transistor 183 and the NMOS transistor 191 is approximately the middle level power supply voltage VML. For this reason, the bias voltage BN3 is the same as that produced on the basis of the middle level power supply voltage VML and takes on a voltage (VML+Vth) that is higher than the middle level power supply voltage VML approximately by the threshold voltage (Vth) of the NMOS transistor 191.

This enables the first floating current source circuit 50 of FIGS. 1 and 4, to which the bias voltages BP3 and BN3 are supplied, to flow a stable constant current that is set in the bias circuit 200A. Furthermore, the bias voltage BP3 makes it possible to implement the clamp operation of the control circuit 70 of FIGS. 1 and 4.

Note that in the bias circuit 200A of FIG. 6, a load element is configured from the NMOS transistor 184 with the source connected to the VSS power supply terminal and the drain and the gate connected together (in a diode connection) and connected to the drain of the PMOS transistor 183. However, the load element may also be constituted, for example, by a resistor element.

Furthermore, when the middle level power supply voltage VML and the middle level power supply voltage VMH have the same supply voltage (for example, VDD/2), the bias circuit 200A of this embodiment can be applied as a circuit for supplying the bias voltages BN3 and BP3 to the output circuit 100B (FIG. 3) of the second embodiment and the output circuit 100D (FIG. 5) of the fourth embodiment. That is, the first floating current source circuit 50 of FIGS. 2 and 5 is capable of flowing a stable constant current that is set in the bias circuit 200A. Furthermore, the bias voltage BN3 makes it possible to implement the clamp operation of the control circuit 70 of FIGS. 3 and 5.

Note that the bias circuit 200A may also be configured to supply the bias voltages BP3 and BN3 to a plurality of output circuits in common. For example, the current value of the constant-current sources 182 and 192 may be multiplied by m, and each type of m PMOS transistors 181 and 183 and m NMOS transistors 191 may be provided in parallel, thereby multiplying the current supply capability of the bias circuit by m.

Sixth Embodiment

Figure 7:
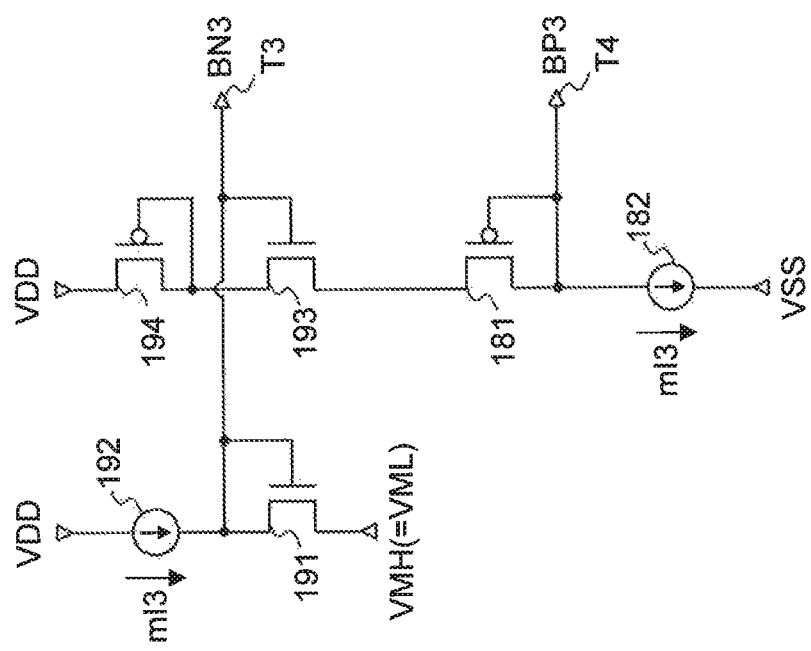
FIG. 7 is a circuit diagram illustrating a configuration of a bias circuit according to a sixth embodiment.

FIG. 7 is a view illustrating a configuration of a bias circuit 200B according to a sixth embodiment of the present invention. For example, the bias circuit 200B supplies the bias voltages BN3 and BP3 to the output circuit 100B (FIG. 3) of the second embodiment and the output circuit 100D (FIG. 5) of the fourth embodiment.

The bias circuit 200B includes the PMOS transistor 181, the constant-current source 182, the NMOS transistor 191, the constant-current source 192, an NMOS transistor 193, and a PMOS transistor 194.

The PMOS transistor 181 has the source connected to the source of the NMOS transistor 193 and the drain connected to one end of the constant-current source 182. The gate and the drain of the PMOS transistor 181 are connected to the output terminal T4 for output of the bias voltage BP3.

The constant-current source 182 has one end connected to the drain of the PMOS transistor 181 and the other end connected to the VSS power supply terminal.

The NMOS transistor 191 has the source connected to the VMH power supply terminal and the drain connected to the other end of the constant-current source 192. The gate and the drain of the NMOS transistor 191 are connected to the output terminal T3 for output of the bias voltage BN3.

The constant-current source 192 has one end connected to the VDD power supply terminal and the other end connected to the drain of the NMOS transistor 191. The constant-current sources 182 and 192 are so set as to flow currents of an equal value mI3.

The NMOS transistor 193 has the drain connected to the drain of the PMOS transistor 194 and the source connected to the source of the PMOS transistor 181. The gate of the NMOS transistor 193 is connected to an output terminal T3 for output of the bias voltage BN3.

The PMOS transistor 194, which is a load element connected between the VDD power supply terminal and the NMOS transistor 193, has the gate and the drain connected together to the drain of the NMOS transistor 193 and the source connected to the VDD power supply terminal.

The bias circuit 200B outputs the voltage of the drain of the NMOS transistor 191 as the bias voltage BN3, and outputs the voltage of the drain of the PMOS transistor 181 as the bias voltage BP3. The bias voltage BN3 is produced on the basis of the middle level power supply voltage VMH, and is a voltage (VMH+Vth) that is higher than the voltage of the middle level power source VMH approximately by the threshold voltage (Vth) of the NMOS transistor 191.

Furthermore, the NMOS transistors 191 and 193 take on a gate voltage that is the bias voltage BN3, and the constant-current sources 182 and 192 provide currents of an equal value. Thus, the common source potential of the NMOS transistor 193 and the PMOS transistor 181 is approximately the middle level power supply voltage VMH. For this reason, the bias voltage BP3 is the same as that produced on the basis of the middle level power supply voltage VMH and takes on a voltage (VMH−|vtp|) which is lower than the middle level power supply voltage VMH approximately by the absolute value of the threshold voltage of the PMOS transistor 181 (|vtp|).

This enables the first floating current source circuit 50 of FIGS. 3 and 5, to which the bias voltages BN3 and BP3 are supplied, to flow a stable constant current that is set in the bias circuit 200B. Furthermore, the bias voltage BN3 makes it possible to implement the clamp operation of the control circuit 70 of FIGS. 3 and 5.

Note that in the bias circuit 200B of FIG. 7, a load element is configured from the PMOS transistor 194 with the source connected to the VDD power supply terminal and the drain and the gate connected together (in a diode connection) and connected to the drain of the NMOS transistor 193. However, the load element may also be constituted, for example, by a resistor element.

Furthermore, when the middle level power supply voltage VML and the middle level power supply voltage VMH have the same supply voltage (for example, VDD/2), the bias circuit 200B of this embodiment can be applied as a circuit for supplying the bias voltages BP3 and BN3 to the output circuit 100A (FIG. 1) of the first embodiment and the output circuit 100C (FIG. 4) of the third embodiment. That is, the first floating current source circuit 50 of FIGS. 1 and 4 is capable of flowing a stable constant current that is set in the bias circuit 200B. Furthermore, the bias voltage BP3 makes it possible to implement the clamp operation of the control circuit 70 of FIGS. 1 and 4.

Note that the bias circuit 200B may also be configured to supply the bias voltages BN3 and BP3 to a plurality of output circuits in common. For example, the current value of the constant-current sources 182 and 192 may be multiplied by m, and each type of m PMOS transistors 181, and m NMOS transistors 191 and 193 may be provided in parallel, thereby multiplying the current supply capability of the bias circuit by m.

Seventh Embodiment

Figure 8:
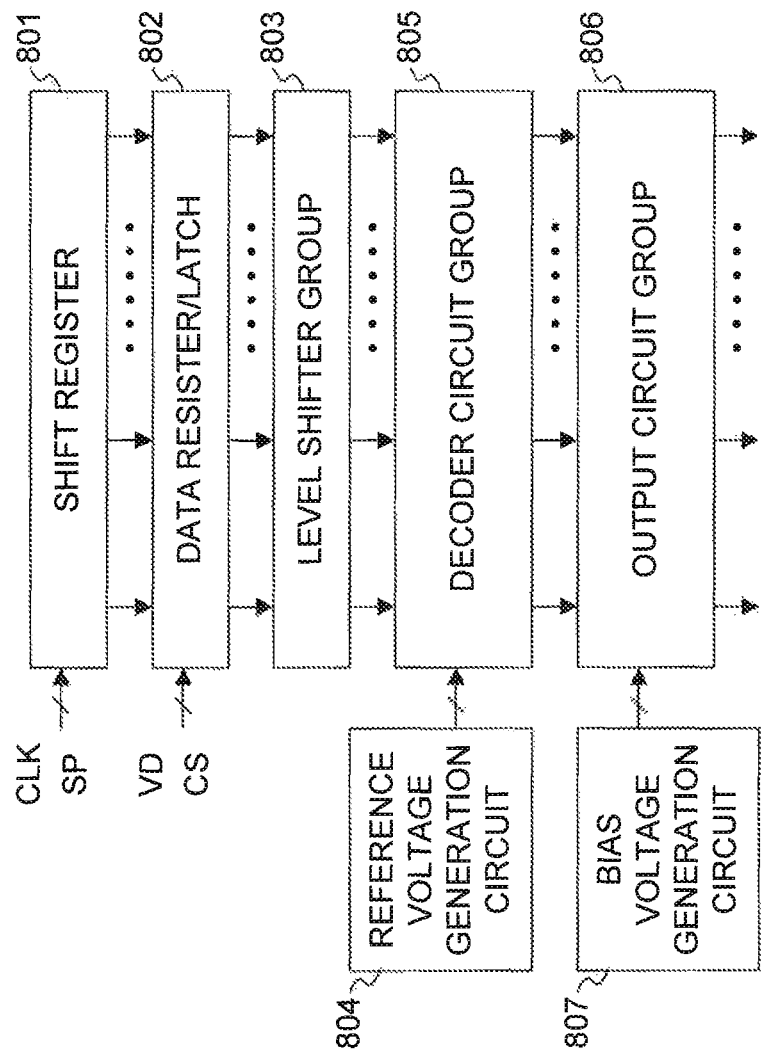
FIG. 8 is a block diagram illustrating a configuration of a data driver according to a seventh embodiment.

FIG. 8 is a view illustrating a configuration of main parts of a data driver 300 of a liquid crystal display device according to a seventh embodiment of the present invention. The data driver 300 is configured to include a shift register 801, a data register/latch 802, a level shifter group 803, a reference voltage generation circuit 804, a decoder circuit group 805, an output circuit group 806, and a bias voltage generation circuit 807.

The shift register 801 determines the timing of a data latch on the basis of a start pulse SP and a clock signal CLK in the data register/latch 802, and supplies a timing signal to the data register/latch 802.

On the basis of the timing signal supplied from the shift register 801, the data register/latch 802 develops entered image digital data VD to a digital data signal in the unit of each output, and latches the same by a predetermined number of outputs. The data register/latch 802 supplies a latched digital data signal to the level shifter group 803 in response to a control signal CS.

The level shifter group 803 converts the digital data signal in the unit of each output supplied from the data register/latch 802 from low-amplitude signal to high-amplitude signal, and supplies the resulting signal to the decoder circuit group 805.

The reference voltage generation circuit 804 produces a plurality of reference voltages (a reference voltage group) and supplies the same to the decoder circuit group 805.

The decoder circuit group 805 selects a reference voltage, depending on the digital data signal supplied from the level shifter group 803, from the reference voltage group supplied from the reference voltage generation circuit 804 for each output.

The output circuit group 806 is configured to include a plurality of output circuits of the first to fourth embodiments (any of the output circuits 100A to 100D of FIGS. 1, 3, 4, and 5) corresponding to the number of outputs. The output circuit group 806 receives one or more entered reference voltages selected by a corresponding decoder in the decoder circuit group 805 for each output, amplifies a gradation signal corresponding to the entered reference voltage, and outputs a drive voltage for driving data lines of a liquid crystal display device (not illustrated). The output terminal group of the output circuit group 806 is each connected to the plurality of data lines of the liquid crystal display device.

The bias voltage generation circuit 807 includes the bias circuit of the fifth or sixth embodiment (any of the bias circuits 200A and 200B of FIGS. 6 and 7). The bias voltage generation circuit 807 supplies a bias voltage signal required for each output circuit (the bias circuits 100A and 100C of FIGS. 1 and 4) that constitutes a positive drive amplifier among a plurality of output circuits included in the output circuit group 806. In particular, the bias voltage generation circuit 807 supplies the bias voltages BP3 and BN3 to the floating current source circuit 50 in the output circuit, and supplies the bias voltage BP3 to the control circuit 70.

Furthermore, the bias voltage generation circuit 807 supplies a bias voltage signal required for each output circuit (the bias circuits 100B and 100D of FIGS. 2 and 5) that constitutes a negative drive amplifier among a plurality of output circuits included in the output circuit group 806. In particular, the bias voltage generation circuit 807 supplies the bias voltages BP3 and BN3 to the floating current source circuit 50 in the output circuit, and supplies the bias voltage BN3 to the control circuit 70.

The shift register 801 and the data register/latch 802, which are a logic circuit, are configured to operate on a low voltage (for example, 0 V/1.8 V) and supplied with a power supply voltage corresponding thereto. The level shifter group 803, the decoder circuit group 805, and the output circuit group 806 are configured to operate on a reference voltage, a middle level voltage, and a high level voltage (for example, 0 V/9 V/18 V) that are required to drive display elements, and supplied with a power supply voltage corresponding thereto.

The data driver 300 of this embodiment is configured to include the output circuits (100A to 100D) according to the respective first to fourth embodiments and the bias circuits (200A, 200B) according to the fifth to sixth embodiments. Thus, according to the embodiments, it is possible to reduce the delay during charging and discharging of a data line connected to the output terminal of the output circuit and implement a high-quality data driver that is robust against, for example, power supply noises.

As described above, according to the present invention, it is possible to reduce an increase in the number of bias lines, thereby reducing the influence of noise and preventing the delay of output signals.

Note that the present invention is not limited to the aforementioned embodiments. For example, in the aforementioned embodiments, a description was given of a configuration in which the output circuit includes the constant-current sources 113 and 116, and the bias circuit includes the constant-current sources 182 and 192. However, these constant-current sources may also be configured, for example, as a transistor with the source supplied with a predetermined power supply and with the gate supplied with a predetermined bias voltage.

Furthermore, the output circuit of the first to fourth embodiments and the bias circuit of the fifth to sixth embodiments can be combined with each other, as appropriate, for use.

This application is based upon and claims the benefit of priority from the prior Japanese Patent Application No. 2016-225894 filed on Nov. 21, 2016, the entire contents of which are incorporated herein by reference.

What is claimed is:

1. An output circuit comprising:
   an input terminal supplied with an input voltage;
   an output terminal supplied with an output voltage;
   a first power supply terminal supplied with a first power supply voltage;
   a second power supply terminal supplied with a second power supply voltage;
   a third power supply terminal supplied with a third power supply voltage having a voltage value between the first power supply voltage and the second power supply voltage;
   a differential input stage connected to the input terminal and the output terminal, the differential input stage producing differential currents corresponding to a difference between the input voltage and the output voltage;
   a first current mirror connected to the first power supply terminal and the differential input stage, and including at least one transistor pair of a first conductivity type;
   a second current mirror connected to the second power supply terminal and the differential input stage, and including at least one transistor pair of a second conductivity type;
   a first current source circuit connected between the first current mirror and the second current mirror, and including a first transistor of the first conductivity type which includes a control terminal supplied with a first bias voltage and a second transistor of the second conductivity type which is connected in series to the first transistor;

an output amplifier circuit including a third transistor of the first conductivity type connected between the first power supply terminal and the output terminal and a fourth transistor of the second conductivity type connected between the third power supply terminal and the output terminal; and a control circuit including a fifth transistor of the first conductivity type and connected to the fourth transistor and the second current mirror.

2. The output circuit according to claim 1, wherein the fifth transistor includes a control terminal supplied with the first bias voltage.

3. The output circuit according to claim 1, further comprising a second current source circuit connected to the third transistor and the forth transistor, and including a plurality of sixth transistors connected in parallel.

4. The output circuit according to claim 3, wherein the third transistor includes a control terminal connected to a first connection point located between the first current mirror and the second current source circuit, and the fourth transistor includes a control terminal connected to a second connection point located between the control circuit and the second current source circuit.

5. An output circuit comprising:

an input terminal supplied with an input voltage;

an output terminal supplied with an output voltage;

a first power supply terminal supplied with a first power supply voltage;

a second power supply terminal supplied with a second power supply voltage;

a third power supply terminal supplied with a third power supply voltage having a voltage value between the first power supply voltage and the second power supply voltage;

a differential input stage connected to the input terminal and the output terminal, the differential input stage producing differential currents corresponding to a difference between the input voltage and the output voltage;

a first current mirror connected to the first power supply terminal and the differential input stage, and including at least one transistor pair of a first conductivity type;

a second current mirror connected to the second power supply terminal and the differential input stage, and including at least one transistor pair of a second conductivity type;

a first current source circuit connected between the first current mirror and the second current mirror, and including a first transistor of the second conductivity type which includes a control terminal supplied with a first bias voltage and a second transistor of the first conductivity type which is connected in series to the first transistor;

an output amplifier circuit including a third transistor of the first conductivity type connected between the third power supply terminal and the output terminal and a fourth transistor of the second conductivity type connected between the second power supply terminal and the output terminal; and a control circuit including a fifth transistor of the second conductivity type and connected to the third transistor and the first current mirror.

6. The output circuit according to claim 5, wherein the fifth transistor includes a control terminal supplied with the first bias voltage.

7. The output circuit according to claim 5, further comprising a second current source circuit connected to the third transistor and the fourth transistor, and including a plurality of sixth transistors connected in parallel.

8. The output circuit according to claim 7, wherein the third transistor includes a control terminal connected to a first connection point located between the control circuit and the second current source circuit, and the fourth transistor includes a control terminal connected to a second connection point located between the second current mirror and the second current source circuit.

9. A data driver comprising an output circuit group that includes a plurality of the output circuits according to claim 1.

* * * * *